(12) United States Patent
Cao et al.

(10) Patent No.: US 9,009,645 B2
(45) Date of Patent: Apr. 14, 2015

(54) AUTOMATIC CLOCK TREE ROUTING RULE GENERATION

(71) Applicant: Synopsys, Inc., Mountain View, CA (US)

(72) Inventors: Aiqun Cao, Sunnyvale, CA (US); Sanjay Dhar, Lake Oswego, OR (US); Lin Yuan, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/066,329

(22) Filed: Oct. 29, 2013

(65) Prior Publication Data

US 2014/0181777 A1    Jun. 26, 2014

Related U.S. Application Data

(60) Provisional application No. 61/746,065, filed on Dec. 26, 2012.

(51) Int. Cl.
*G06F 17/50* (2006.01)

(52) U.S. Cl.
CPC .................................. *G06F 17/5077* (2013.01)

(58) Field of Classification Search
CPC ... G06F 1/10; G06F 2217/62; G06F 17/5077; H03B 5/1852
USPC .................................. 716/115, 126, 130, 134
See application file for complete search history.

(56) References Cited

U.S. PATENT DOCUMENTS

| | | | | |
|---|---|---|---|---|
| 5,774,371 A * | 6/1998 | Kawakami | ..................... | 716/113 |
| 6,204,713 B1 * | 3/2001 | Adams et al. | ................. | 327/295 |
| 6,651,232 B1 * | 11/2003 | Pileggi et al. | ................. | 716/114 |
| 7,039,891 B2 * | 5/2006 | Tetelbaum | ..................... | 716/113 |
| 7,178,124 B1 * | 2/2007 | Makarov et al. | ............... | 716/122 |
| 7,752,588 B2 * | 7/2010 | Bose | ............................. | 716/122 |
| 7,996,796 B2 * | 8/2011 | Nonaka et al. | ................ | 716/100 |
| 8,239,797 B1 | 8/2012 | Ghosh et al. | | |
| 2004/0199884 A1 | 10/2004 | Brittain et al. | | |
| 2004/0243956 A1 * | 12/2004 | Tetelbaum et al. | ............... | 716/6 |
| 2006/0294485 A1 | 12/2006 | Kaul et al. | | |
| 2008/0201678 A1 | 8/2008 | Ang et al. | | |
| 2011/0061038 A1 | 3/2011 | Qiao et al. | | |

* cited by examiner

*Primary Examiner* — Sun Lin
(74) *Attorney, Agent, or Firm* — Park, Vaughan, Fleming & Dowler LLP; Laxman Sahasrabuddhe

(57) ABSTRACT

Systems and techniques are described for automatically generating a set of non-default routing rules for routing a net in a clock tree based on one or more metrics. The metrics can include a congestion metric, a latency metric, a crosstalk metric, an electromigration metric, and a clock tree level. Next, the embodiments can generate the set of non-default routing rules for routing the net based on one or more metrics. A routing rule can specify how wide the wires are supposed to be and how far apart adjacent wires are to be placed. A non-default routing rule can specify a wire width that is different from the default width and/or specify a spacing (i.e., the distance between two wires) that is different from the default spacing.

17 Claims, 3 Drawing Sheets

AUTOMATIC CLOCK TREE ROUTING RULE GENERATION

RELATED APPLICATION

This application claims priority to U.S. Provisional Patent Application No. 61/746,065, entitled "Automatic clock tree routing rule generation," by the same inventors, and was filed on 26 Dec. 2012, the contents of which are herein incorporated by reference in their entirety for all purposes.

BACKGROUND

1. Technical Field

This disclosure relates to clock tree synthesis during electronic circuit design. More specifically, this disclosure relates to automatic clock tree routing rule generation.

2. Related Art

Advances in semiconductor technology presently make it possible to integrate hundreds of millions of transistors onto a single semiconductor chip. This dramatic increase in semiconductor integration densities has made it considerably more challenging to design circuits.

Clock tree synthesis (CTS) and routing are two important operations in electronic design automation (EDA). CTS refers to the process of creating a clock distribution network for distributing a clock signal to a set of sequential circuit elements in a circuit design. Routing a circuit design (which includes routing one or more clock trees in the circuit design) involves determining routes for metal wires which electrically connect circuit elements to produce routed circuits that perform desired functions. The quality of the routed clock trees that are generated by a router can have a significant impact on downstream stages in the EDA design flow.

SUMMARY

Some embodiments automatically generate (i.e., without requiring a user to manually generate the rules) a set of non-default routing rules for routing a net in a clock tree based on one or more metrics. Some embodiments can determine one or more of the following metrics: (1) a congestion metric for the net, wherein the congestion metric corresponds to an amount of routing congestion in proximity to the net, (2) a latency metric for the net, wherein the latency metric corresponds to a clock latency of a longest latency clock path that includes the net, (3) a crosstalk metric for the net, wherein the crosstalk metric corresponds to an amount of crosstalk that the net receives from other nets, (4) an electromigration metric for the net, wherein the electromigration metric corresponds to an amount of electromigration that is expected to occur in the net, and (5) a clock tree level for the net, wherein the root of the clock tree corresponds to the highest clock tree level.

Next, the embodiments can generate the set of non-default routing rules for routing the net based on one or more metrics. A routing rule can specify how wide the wires are supposed to be and how far apart adjacent wires are to be placed. A non-default routing rule can specify a wire width that is different from the default width and/or specify a spacing (i.e., the distance between two wires) that is different from the default spacing. Specifically, in response to determining that the congestion metric indicates that the net is in a high congestion region, some embodiments can generate a routing rule that uses a default rule wire width, a default rule spacing, or both. On the other hand, in response to determining that the congestion metric indicates that the net is not in a high congestion region, some embodiments can generate one or more of the following routing rules: (1) a routing rule that uses a wire width that is wider than a default rule wire width, a spacing that is wider than a default rule spacing, or both, (2) a routing rule that uses a wire width and/or a spacing that prevents the net from violating a clock latency rule, (3) a routing rule that uses a wire width and/or a spacing that prevents the net from violating a crosstalk rule, (4) a routing rule that uses a wire width and/or a spacing that prevents the net from violating an electromigration rule, and/or (5) a routing rule that uses a width value and a spacing value based on the clock tree level, wherein greater width and spacing values are used at higher clock tree levels.

DETAILED DESCRIPTION

Figure 1:
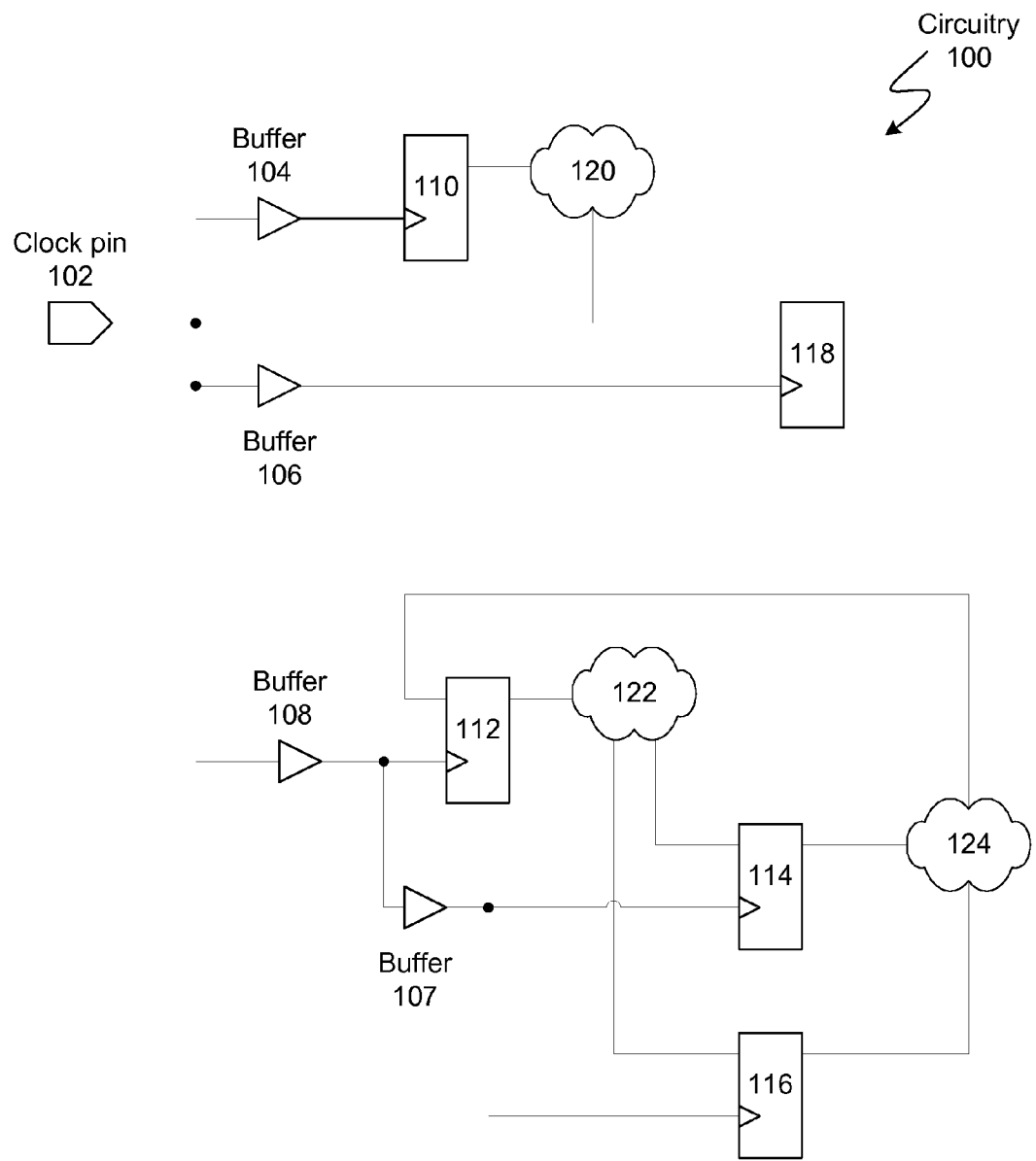
FIG. 1 illustrates synchronous circuitry in accordance with some embodiments described herein.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z. Additionally, in this disclosure, the term "based on" means "based solely or partially on."

Overview of an Electronic Design Automation (EDA) Flow

An EDA flow can be used to create a circuit design. Once the circuit design is finalized, it can undergo fabrication, packaging, and assembly to produce integrated circuit chips. An EDA flow can include multiple steps, and each step can involve using one or more EDA software tools. Some EDA steps and software tools are described below. These examples of EDA steps and software tools are illustrative purposes only and are not intended to limit the embodiments to the forms disclosed.

Some EDA software tools enable circuit designers to describe the functionality that they want to implement. These tools also enable circuit designers to perform what-if planning to refine functionality, check costs, etc. During logic design and functional verification, the HDL (hardware description language), e.g., SystemVerilog, code for modules in the system can be written and the design can be checked for functional accuracy, e.g., the design can be checked to ensure that it produces the correct outputs.

During synthesis and design for test, the HDL code can be translated to a netlist using one or more EDA software tools.

Further, the netlist can be optimized for the target technology, and tests can be designed and implemented to check the finished chips. During netlist verification, the netlist can be checked for compliance with timing constraints and for correspondence with the HDL code.

During design planning, an overall floorplan for the chip can be constructed and analyzed for timing and top-level routing. During physical implementation, circuit elements can be positioned in the layout (placement) and can be electrically coupled (routing).

During analysis and extraction, the circuit's functionality can be verified at a transistor level and parasitics can be extracted. During physical verification, the design can be checked to ensure correctness for manufacturing, electrical issues, lithographic issues, and circuitry.

During resolution enhancement, geometric manipulations can be performed on the layout to improve manufacturability of the design. During mask data preparation, the design can be "taped-out" to produce masks which are used during fabrication.

Clock Trees

Synchronous circuit designs can be viewed as a collection of sequential circuit elements that are electrically connected via combinational logic clouds. For example, FIG. 1 illustrates synchronous circuitry in accordance with some embodiments described herein. Circuitry 100 includes buffers 104, 106, 107, and 108, sequential circuit elements 110, 112, 114, 116, and 118, and combinational logic clouds 120, 122, and 124. A clock signal is distributed from clock pin 102 to sequential circuit elements 110, 112, 114, 116, and 118 via a clock tree that includes buffers 104, 106, 107, and 108. A sequential circuit element is generally any element that performs an operation based on a clock signal. For example, a flip-flop is a sequential circuit element. A combinational logic cloud includes one or more combinational logic gates (e.g., AND gates, OR gates, NOT gates, XOR gates, multiplexers, demultiplexers, buffers, repeaters, etc.), but does not include any sequential circuit elements.

Data transfer between sequential circuit elements is synchronized using one or more clock signals. For example, sequential circuit element 110 can launch a signal that passes through combinational logic cloud 120 (which may logically combine the signal with other signals), and which can then be captured by sequential circuit element 118. The launch and capture are synchronized based on the clock signal that is provided to sequential circuit elements 110 and 118.

A clock tree comprises circuitry that distributes a clock signal to one or more sequential circuit elements in the circuit design. For example, the clock tree shown in FIG. 1 includes buffers 104, 106, 107, and 108, and electrically connects clock pin 102 to the clock input pins of sequential circuit elements 110, 112, 114, 116, and 118. A clock domain can refer to a portion of a circuit design that is clocked using a given clock signal. For example, circuitry 100 shown in FIG. 1 is part of the clock domain that corresponds to the clock signal that is distributed from clock pin 102. A circuit design may include multiple clock domains, and each clock domain can include multiple clock trees.

Routing

Figure 2:
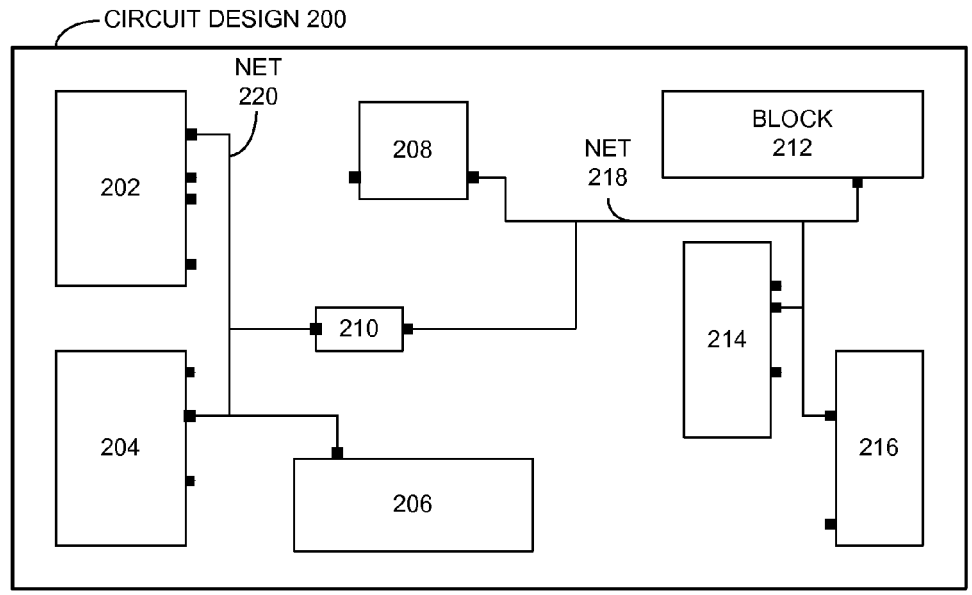
FIG. 2 illustrates an exemplary circuit design that presents a generic routing problem in accordance with an embodiment of the present invention.

Once a clock tree has been created (e.g., the electrical connectivity and buffer locations have been determined), the clock tree has to be routed. FIG. 2 illustrates an exemplary circuit design that presents a generic routing problem in accordance with an embodiment of the present invention. Circuit design 200 includes a set of blocks (e.g., blocks 202, 204, 206, 208, 210, 212, 214, and 216) that may represent circuit objects at any level in the design hierarchy. For example, the blocks can be cells, macros, buffers, or any other circuit object at any level of hierarchy.

A circuit element (e.g., a buffer, a sequential circuit element, etc.) can have one or more pins, and each pin may be assigned to a net. The task for the routing process or system is to route wires in the circuit design so that the pins that are assigned to the same net are electrically connected to one another. For example, net 220 electrically connects pins in blocks 202, 204, 206, and 210, and net 218 electrically connects pins in blocks 208, 210, 212, 214, and 216.

A routing process or system can take multiple inputs, which include, but are not limited to: (a) a placed netlist which provides placement information for a set of cells (e.g., buffers, sequential circuit elements, etc.), (b) a description of the technology (i.e., the number of metal layers, and the characteristics of the layers), (c) an assignment of pins/terminals to nets, (d) a set of non-default routing rules that specify wire widths and spacing, (e) a set of nets that use non-default rules and information about the non-default rule that is to be used for each of these nets, and (f) a set of design rules that must be satisfied by the routing solution. Note that a routing system should not generate a routing solution that electrically connects pins that belong to different nets. Further, the routing system should generate a routing solution that routes the wires using only the available routing resources, and the routed solution must not violate DRCs (note that the DRCs are usually provided as an input to the routing problem). For example, the DRCs may specify the minimum wire width, the minimum distance between two adjacent wires, routing shapes are not to be used, etc.

The output of the routing system includes, but is not limited to, a netlist which electrically connects all pins/terminals that belong to each net (e.g., a portion of a clock tree), and a routing summary which can include wire length, via count, and unresolved design rule checks (DRCs).

Because of the important role that clock trees play in a circuit design, and because clock trees need to satisfy special requirements (i.e., requirements that may be non-existent or may not be so important for other parts of the circuit design), the routing rules that are used for routing a clock tree are often different from those that are used for routing other nets in the circuit design. These special routing rules that are used for routing clock trees are sometimes referred to as non-default routing rules or non-default rules (NDRs) to distinguish these routing rules from "default" routing rules that are used, by default, to route nets in the circuit design.

In conventional approaches, users (e.g., circuit designers) need to provide a set of NDRs for routing clock trees. However, these approaches are prone to user error and are becoming impractical as semiconductor integration densities continue to increase and circuit designs become increasingly more complex. Furthermore, it is difficult, if not impossible, for a user to specify the appropriate NDRs for a net before the clock tree is built. Therefore, in conventional approaches, the clock tree has to be routed multiple times so that the user can iteratively fine tune the NDRs.

Process for Automatically Creating NDRs for Routing Clock Trees

Some embodiments described in this disclosure automatically create a set of NDRs for routing clock trees. The NDRs are created based on analyzing the circuit design, and help (1) prevent crosstalk on clock nets (it is important to keep the clock signal as clean as possible to ensure proper operation of the circuit design), (2) prevent electromigration (EM) on clock nets (clock signals can be driven by large drivers which can increase the occurrence of EM), (3) reduce clock latency, and (4) improve routability of clock nets.

Figure 3:
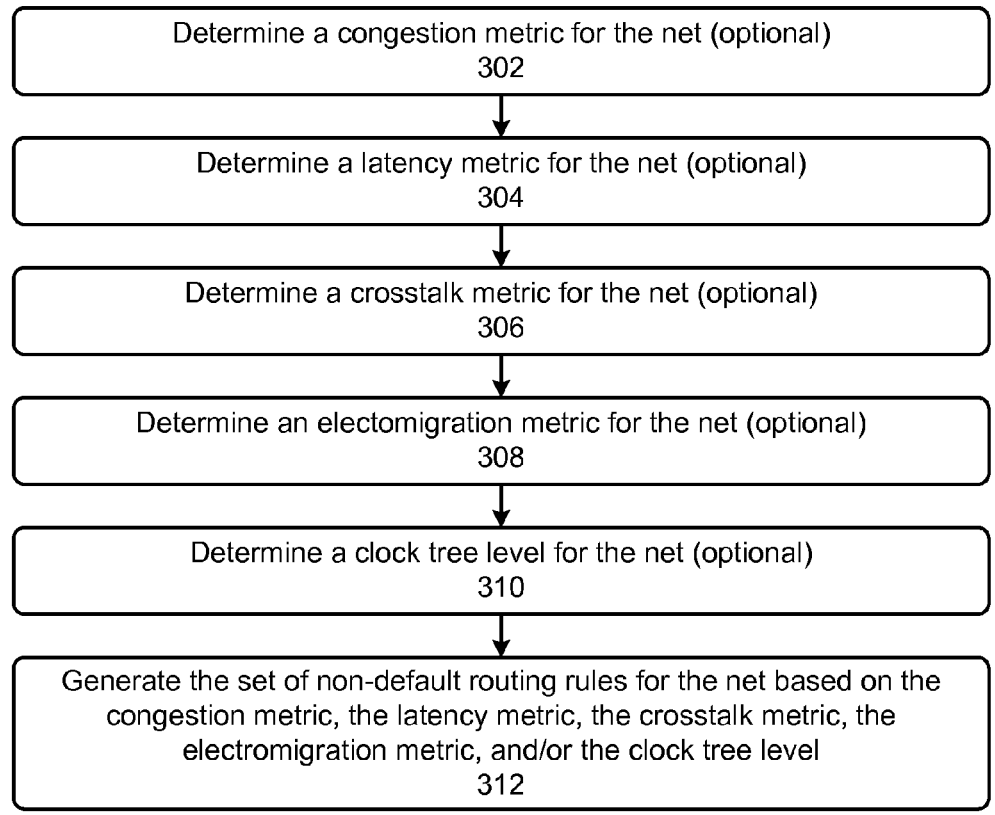
FIG. 3 illustrates a process for generating a set of non-default routing rules for routing a net in a clock tree in accordance with some embodiments described herein.

FIG. 3 illustrates a process for generating a set of non-default routing rules for routing a net in a clock tree in accordance with some embodiments described herein. The process can involve determining one or more metrics for the net, and then determining the set of NDRs based on the metrics. Specifically, the process can involve determining a congestion metric for the net (operation 302), a latency metric for the net (operation 304), a crosstalk metric for the net (operation 306), an electromigration metric for the net (operation 308), and/or a clock tree level (operation 310).

The congestion metric can correspond to an amount of routing congestion in proximity to the net. In some embodiments, a congestion metric can be determined as follows. The circuit design can be divided into an array of rectangles or squares called g-cells. Each g-cell is associated with a capacity that indicates the number of wires that can be routed through the g-cell. Next, based on an initial placement of circuit blocks, the process can determine the number of wires that need to be routed from one g-cell cell to another. The process can then determine approximate routes for these wires (i.e., at the g-cell level), and keep track of the number of wires that are passing through each g-cell. The process can then determine the congestion metric for a g-cell based on the capacity of the g-cell and the number of wires that are expected to be routed through the g-cell. The congestion metric for a net can be the average of the congestion metrics of g-cells that are partially or completely within a bounding box of the net. For example, if there are N g-cells that are partially or completely within the bounding box of the net (the bounding of a net can be a rectangular box that encloses all of the pins of the net), then the congestion metric associated with the net can be the average of the congestion metrics of these N g-cells. In other embodiments, the maximum congestion metric among these N g-cells (or any other statistical measure based on the congestion metrics of the N g-cells) can be used.

The latency metric can correspond to a clock latency of a longest latency clock path that includes the net. In some embodiments, the latency metric can be a flag, i.e., a value that is a "0" or a "1." A "0" value can indicate that the net is not part of the longest (or nearly the longest) clock path. A "1" value can indicate that the net is part of the longest (or nearly the longest) clock path.

For example, consider the net in FIG. 1 that electrically connects clock pin 102 with the inputs of buffers 104, 106, and 108. This net is part of multiple clock paths. For example, this net is part of the clock path that begins at clock pin 102 and ends at the clock input of sequential circuit element 110, and is also part of the clock path that begins at clock pin 102 and ends at the clock input of sequential circuit element 116. Out of all clock paths that include this net, let us assume that the clock path that begins at clock pin 102 and ends at the clock input of sequential circuit element 116 has the greatest delay. Then, the latency metric of net that electrically connects clock pin 102 with the inputs of buffers 104, 106, and 108 can be set to "1". On the other hand, let us assume that the net that connects the output of buffer 104 to the clock input of sequential circuit element 110 is not part of the longest (or nearly the longest) clock path. Then, the latency metric of the net that electrically connects the output of buffer 104 to the clock input of sequential circuit element 110 can be set to "0."

The crosstalk metric can correspond to an amount of crosstalk that the net receives from other nets. In some embodiments, the system can determine the amount of jitter that is introduced into the clock signal due to crosstalk, and use the amount of jitter as the crosstalk metric. The amount of jitter (and correspondingly the crosstalk metric) can be represented as an absolute jitter (i.e., in units of time) or as a fraction of one clock period. Additionally, the amount of jitter can be quantified as the peak-to-peak jitter or the root-mean-squared jitter.

The electromigration metric can correspond to an amount of electromigration that is expected to occur in the net. In some embodiments, the mean time to failure (MTTF) due to electromigration (e.g., computed using Black's Equation) can be used as the electromigration metric. The net can be considered to violate the electromigration constraint if the MTTF value is less than a given threshold. In some embodiments, the eletromigration metric can be a flag, i.e., it can have a "0" or "1" value. Specifically, the MTTF can be computed and compared with a threshold value (e.g., an acceptable MTTF value). If the MTTF value is greater than the threshold, then the electromigration metric flag can be set to "0" which indicates that the net does not violate the electromigration constraint. On the other hand, if the MTTF value is less than the threshold, then the electromigration metric flag can be set to "1" which indicates that the net violates the electromigration constraint.

The process can partition the clock tree into two or more levels (e.g., by performing a tree traversal by starting from the root of the clock tree), and the net can be associated with a clock tree level depending on where the net is located in the clock tree. Some embodiments described in this disclosure divide the clock tree into multiple levels, e.g., a clock root level, a clock trunk level, and a clock leaf level. For example, in FIG. 1, the clock tree can be partitioned into the following levels. A root level that includes the net that electrically connects clock pin 102 with the inputs of buffers 104, 106, and 108. A trunk level that includes the net that electrically connects the output of buffer 108 with the clock input of sequential circuit element 112 and the input of buffer 107. A leaf level that includes the following nets: (a) the net that electrically connects the output of buffer 104 with the clock input of sequential circuit element 110, (b) the net that electrically connects the output of buffer 106 with the clock input of sequential circuit element 118, and (c) the net that electrically connects the output of buffer 107 with the clock inputs of sequential circuit elements 114 and 116.

The above examples of metrics have been presented for illustration purposes only and are not intended to limit the embodiments to the forms disclosed. Many different definitions of congestion, latency, crosstalk, electromigration, and clock tree level metrics will be apparent to a person having ordinary skill in the art, and the scope of the embodiments described herein are intended to cover all such definitions.

Once one or more metrics have been determined, a set of non-default routing rules can be generated for the net based on the congestion metric, the latency metric, the crosstalk metric, the electromigration metric, and/or the clock tree level (operation 312).

Specifically, to prevent crosstalk and/or electromigration violations, the embodiments can use a wider width and/or a wider spacing for routing nets. Likewise to reduce the clock latency of a clock path, the embodiments can use a wider width and/or a wider spacing for routing nets. However, using a wider width and/or a wider spacing consumes greater routing resources. Therefore, in high congestion regions it may not be possible to use a wider wire width or a wider spacing.

In some embodiments, the process can compute the different metrics for the net and then select an appropriate wire width and wire spacing based on the computed metrics. For example, in response to determining that the congestion metric indicates that the net is not in a high congestion region, the process can generate a routing rule that uses a wire width that is wider than a default rule wire width, a spacing that is wider than a default rule spacing, or both (i.e., a rule that uses wider wires and spaces them farther apart). On the other hand, in response to determining that the congestion metric indicates that the net is in a high congestion region, the process can generate a routing rule that uses a default rule wire width, a default rule spacing, or both.

If the congestion metric indicates that the net is not in a high congestion region, some embodiments can generate a routing rule that (1) uses a wire width and/or a spacing that prevents the net from violating a clock latency rule, (2) uses a wire width and/or a spacing that prevents the net from violating a crosstalk rule, (3) uses a wire width and/or a spacing that prevents the net from violating an electromigration rule, and/or (4) uses a width value and a spacing value based on the clock tree level. Specifically, some embodiments can create a different set of NDRs for each clock tree level, e.g., the process can use different wire widths and/or spacing depending on whether a net is in the root level, the trunk level, or the leaf level of the clock tree. In particular, the process can use widest wires and/or largest spacing for the root level and use progressively smaller width and/or spacing for the trunk level and the leaf level. For example, in some embodiments, the process can use triple width and triple spacing for the root level, double width and double spacing for the trunk level, and single width and single or double spacing for the leaf level.

Computer System

Figure 4:
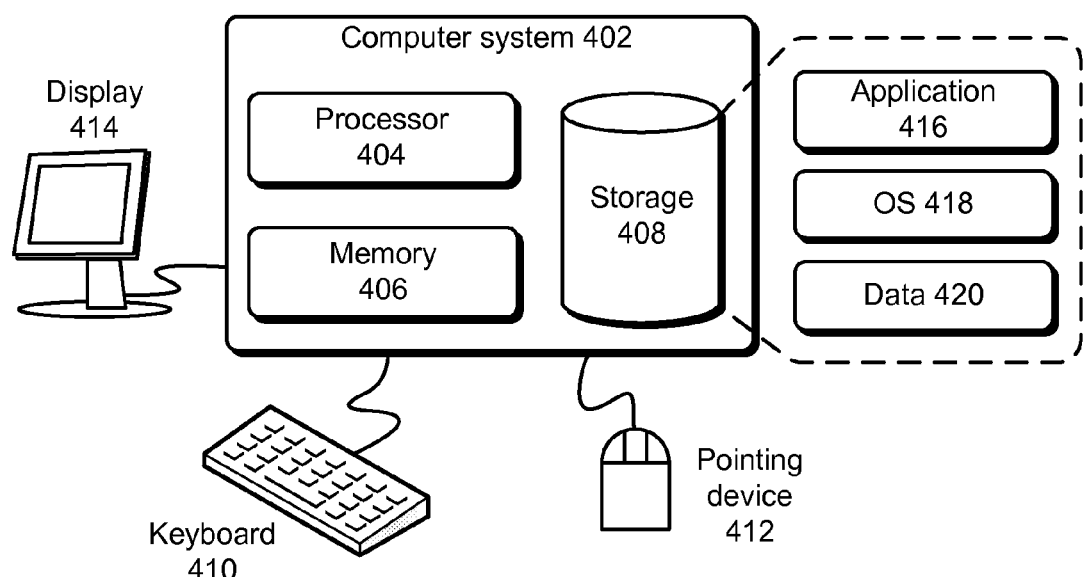
FIG. 4 illustrates a computer system in accordance with some embodiments described herein.

FIG. 4 illustrates a computer system in accordance with an embodiment of the present invention. A computer or a computer system can generally be any system that can perform computations. Specifically, a computer system can be a microprocessor, an application specific integrated circuit, a distributed computing system, a cloud computing system, or any other computing system now known or later developed. Computer system 402 comprises processor 404, memory 406, and storage 408. Computer system 402 can be coupled with display 414, keyboard 410, and pointing device 412. Storage 408 can generally be any device that can store data. Specifically, a storage device can be a magnetic, an optical, or a magneto-optical storage device, or it can be based on flash memory and/or battery-backed up memory. Storage 408 can store application 416, operating system 418, and data 420.

Application 416 can include instructions that when executed by computer 402 cause computer 402 to perform one or more processes that are implicitly or explicitly described in this disclosure. Data 420 can include any data that is inputted into or outputted by application 416.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. In an electronic design automation (EDA) tool, a computer-implemented method for generating a set of non-default routing rules for routing a clock tree, the computer-implemented method comprising:
   determining, by using one or more processors, a congestion metric for a net, wherein the congestion metric corresponds to an amount of routing congestion in proximity to the net;
   determining a clock tree level for the net, wherein a root of the clock tree corresponds to a highest clock tree level; and
   in response to determining that the congestion metric indicates that the net is not in a high congestion region, generating a non-default routing rule that uses a width value and a spacing value based on the clock tree level, wherein greater width values and spacing values are used at higher clock tree levels.

2. The computer-implemented method of claim 1, wherein said generating includes:
   in response to determining that the congestion metric indicates that the net is not in a high congestion region, generating a non-default routing rule that uses a wire width that is wider than a default rule wire width and/or a spacing that is wider than a default rule spacing.

3. The computer-implemented method of claim 1, wherein said generating includes:
   in response to determining that the congestion metric indicates that the net is in a high congestion region, generating a non-default routing rule that uses a default rule wire width and/or a default rule spacing.

4. The computer-implemented method of claim 1, further comprising:
   determining a latency metric for the net, wherein the latency metric corresponds to a clock latency of a longest latency clock path that includes the net; and
   wherein said generating includes generating at least one non-default routing rule in the set of non-default routing rules based on the congestion metric and the latency metric.

5. The computer-implemented method of claim 4, wherein said generating includes:

in response to determining that the congestion metric indicates that the net is not in a high congestion region, generating a non-default routing rule that uses a wire width and/or a spacing that prevents the net from violating a clock latency rule.

6. The computer-implemented method of claim 1, further comprising:
   determining a crosstalk metric for the net, wherein the crosstalk metric corresponds to an amount of crosstalk that the net receives from other nets; and
   wherein said generating includes generating at least one non-default routing rule in the set of non-default routing rules based on the congestion metric and the crosstalk metric.

7. The computer-implemented method of claim 6, wherein said generating includes:
   in response to determining that the congestion metric indicates that the net is not in a high congestion region, generating a non-default routing rule that uses a wire width and/or a spacing that prevents the net from violating a crosstalk rule.

8. The computer-implemented method of claim 1, further comprising:
   determining an electromigration metric for the net, wherein the electromigration metric corresponds to an amount of electromigration that is expected to occur in the net; and
   wherein said generating includes generating at least one non-default routing rule in the set of non-default routing rules based on the congestion metric and the electromigration metric.

9. The computer-implemented method of claim 8, wherein said generating includes:
   in response to determining that the congestion metric indicates that the net is not in a high congestion region, generating a non-default routing rule that uses a wire width and/or a spacing that prevents the net from violating an electromigration rule.

10. A non-transitory computer-readable storage medium storing instructions that, when executed by a computer, cause the computer to execute a method for generating a set of non-default routing rules for routing a clock tree, the method comprising:
    determining a congestion metric for a net, wherein the congestion metric corresponds to an amount of routing congestion in proximity to the net;
    determining a clock tree level for the net, wherein a root of the clock tree corresponds to a highest clock tree level; and
    in response to determining that the congestion metric indicates that the net is not in a high congestion region, generating a non-default routing rule that uses a width value and a spacing value based on the clock tree level, wherein greater width values and spacing values are used at higher clock tree levels.

11. The non-transitory computer-readable storage medium of claim 10, further comprising:
    determining a latency metric for the net, wherein the latency metric corresponds to a clock latency of a longest latency clock path that includes the net; and
    wherein said generating includes, in response to determining that the congestion metric indicates that the net is not in a high congestion region, generating a non-default routing rule that uses a wire width and/or a spacing that prevents the net from violating a clock latency rule.

12. The non-transitory computer-readable storage medium of claim 10, further comprising:
    determining a crosstalk metric for the net, wherein the crosstalk metric corresponds to an amount of crosstalk that the net receives from other nets; and
    wherein said generating includes, in response to determining that the congestion metric indicates that the net is not in a high congestion region, generating a non-default routing rule that uses a wire width and/or a spacing that prevents the net from violating a crosstalk rule.

13. The non-transitory computer-readable storage medium of claim 10, further comprising:
    determining an electromigration metric for the net, wherein the electromigration metric corresponds to an amount of electromigration that is expected to occur in the net; and
    wherein said generating includes, in response to determining that the congestion metric indicates that the net is not in a high congestion region, generating a non-default routing rule that uses a wire width and/or a spacing that prevents the net from violating an electromigration rule.

14. An apparatus, comprising:
    a processor; and
    non-transitory computer-readable storage medium storing instructions that, when executed by the processor, cause the apparatus to execute a method for generating a set of non-default routing rules for routing a clock tree, the method comprising:
        determining a congestion metric for a net, wherein the congestion metric corresponds to an amount of routing congestion in proximity to the net;
        determining a clock tree level for the net, wherein a root of the clock tree corresponds to a highest clock tree level; and
        in response to determining that the congestion metric indicates that the net is not in a high congestion region, generating a non-default routing rule that uses a width value and a spacing value based on the clock tree level, wherein greater width values and spacing values are used at higher clock tree levels.

15. The apparatus of claim 14, wherein the method executed by the apparatus further comprising:
    determining a latency metric for the net, wherein the latency metric corresponds to a clock latency of a longest latency clock path that includes the net; and
    wherein said generating includes, in response to determining that the congestion metric indicates that the net is not in a high congestion region, generating a non-default routing rule that uses a wire width and/or a spacing that prevents the net from violating a clock latency rule.

16. The apparatus of claim 14, wherein the method executed by the apparatus further comprising:
    determining a crosstalk metric for the net, wherein the crosstalk metric corresponds to an amount of crosstalk that the net receives from other nets; and
    wherein said generating includes, in response to determining that the congestion metric indicates that the net is not in a high congestion region, generating a non-default routing rule that uses a wire width and/or a spacing that prevents the net from violating a crosstalk rule.

17. The apparatus of claim 14, wherein the method executed by the apparatus further comprising:
    determining an electromigration metric for the net, wherein the electromigration metric corresponds to an amount of electromigration that is expected to occur in the net; and
    wherein said generating includes, in response to determining that the congestion metric indicates that the net is not in a high congestion region, generating a non-default routing rule that uses a wire width and/or a spacing that prevents the net from violating an electromigration rule.

* * * * *